(12) United States Patent
Kadow et al.

(10) Patent No.: US 9,112,021 B2
(45) Date of Patent: Aug. 18, 2015

(54) HIGH VOLTAGE BIPOLAR TRANSISTOR WITH TRENCH FIELD PLATE

(75) Inventors: Christoph Kadow, Gauting (DE); Thorsten Meyer, München (DE); Norbert Krischke, München (DE)

(73) Assignee: Infineon Technologies Austria AG, Villach (AT)

( * ) Notice: Subject to any disclaimer, the term of this patent is extended or adjusted under 35 U.S.C. 154(b) by 244 days.

(21) Appl. No.: 13/618,225

(22) Filed: Sep. 14, 2012

(65) Prior Publication Data

US 2013/0009252 A1    Jan. 10, 2013

Related U.S. Application Data

(62) Division of application No. 12/833,202, filed on Jul. 9, 2010, now Pat. No. 8,319,282.

(51) Int. Cl.
| | | |
|---|---|---|
| *H01L 21/331* | (2006.01) | |
| *H01L 29/78* | (2006.01) | |
| *H01L 29/40* | (2006.01) | |
| *H01L 29/423* | (2006.01) | |
| *H01L 29/06* | (2006.01) | |

(52) U.S. Cl.
CPC .......... *H01L 29/7813* (2013.01); *H01L 29/407* (2013.01); *H01L 29/42368* (2013.01); *H01L 29/0696* (2013.01); *H01L 29/4238* (2013.01)

(58) Field of Classification Search
CPC .............. H01L 29/407; H01L 29/7813; H01L 29/42368; H01L 29/0696; H01L 29/42383; H01L 29/7378; H01I 29/1004; H01I 29/407; H01I 29/42304
USPC ............. 438/364, 360, 350; 257/378, E21.37
See application file for complete search history.

(56) References Cited

U.S. PATENT DOCUMENTS 7,132,344 B1 *   11/2006   Knorr ........................... 438/313

FOREIGN PATENT DOCUMENTS

DE    102004052610 A1    5/2006
DE    112004002608 T5    11/2006

* cited by examiner

*Primary Examiner* — Thinh T Nguyen
(74) *Attorney, Agent, or Firm* — Murphy, Bilak & Homiller, PLLC

(57) ABSTRACT

A bipolar transistor structure includes an epitaxial layer on a semiconductor substrate, a bipolar transistor device formed in the epitaxial layer and a trench structure formed in the epitaxial layer adjacent at least two opposing lateral sides of the bipolar transistor device. The trench structure includes a field plate spaced apart from the epitaxial layer by an insulating material. The bipolar transistor structure further includes a base contact connected to a base of the bipolar transistor device, an emitter contact connected to an emitter of the bipolar transistor device and isolated from the base contact and an electrical connection between the emitter contact and the field plate.

13 Claims, 7 Drawing Sheets ion. Avalanche breakdown
HIGH VOLTAGE BIPOLAR TRANSISTOR WITH TRENCH FIELD PLATE

RELATED APPLICATION

This application is a divisional application of U.S. patent application Ser. No. 12/833,202, filed 9 Jul. 2010, the entire contents of which are incorporated herein by reference.

BACKGROUND

The breakdown voltage of a power MOS (metal-oxide-semiconductor) device such as a VDMOS (vertically diffused metal oxide semiconductor) transistor can range from about 30V to several hundred volts (e.g. 100V to 200V) depending on the technology used to fabricate the device. A very large amount of current flows in a DMOS device for drain voltages above the breakdown voltage. This condition is typically referred to as avalanche breakdown. Avalanche breakdown destroys power DMOS devices if left unabated.

For a bipolar transistor, the maximum operating voltage is typically limited to a value below the collector-base diode breakdown voltage (Vcbo), and above the collector-emitter breakdown voltage (Vceo) for a bipolar device with a floating base. Device instability can arise when a bipolar device is in active operation between Vceo and Vcbo. When Vice rises above a certain critical voltage, the bipolar device enters a high current state. The high-current state is driven by bipolar amplification of the impact-ionization current generated in the base-collector space-charge region of the device. In some cases, the bipolar device may go into a lateral instability or pinch-in instability where the current flow pinches into a very narrow channel at the point furthest away from the base contacts. The bipolar device may enter a vertical instability or plasma state with the base and the base-collector space-charge region flooded with carriers of both types. This state corresponds to the Vceo breakdown voltage for the switched off device. In this state and depending on the bias conditions on the base and emitter, the total current can still be limited by the device itself due to an effective reduction of the peak electrical field by the carriers flooding the base collector space charge region. Each of these high current states results in an oscillating behavior with quite high amplitudes on the emitter and base. Even if the bipolar device itself is not destroyed in this oscillating state, the oscillations pose a very serious threat to other low voltage devices in adjacent circuit blocks and should be avoided.

Because of these effects, the operating voltage of a bipolar transistor is smaller than that of a corresponding unipolar device such as a vertical DMOS constructed in the same epitaxial semiconductor layer. This limits the technology voltage of an integrated power technology which provides both power and bipolar transistors on the same die, and thus poses a severe constraint for the optimization of the technology, particularly with respect to DMOS on resistance. In essence, a trade-off must be made between a highly doped thin epitaxial layer which is favorable for power transistors and a lower doped thicker epitaxial layer which is advantageous for bipolar transistors.

Existing power technologies especially of the CMOS-DMOS type (i.e. vertical DMOS with a common drain on the substrate) must take great care to avoid triggering of parasitic substrate bipolars and control the maximum collector voltage during active operation of the parasitic substrate bipolars. Also, the minimum usable thickness of the epitaxial layer is a highly important optimization parameter for on-resistance of a DMOS device and can be limited by the parasitic substrate bipolars. For some power applications, SOI (silicon-on-insulator) technologies can be used, where devices are dielectrically isolated and thus can be more easily optimized individually. However, SOI costs more than non-SOI technologies. In advanced bipolar technologies, deep trench isolation and/or shallow trench isolation is used to terminate the bipolar device, but not as a constructive element of the core bipolar transistor. Instead, the trench structures are only used for lateral isolation and do not affect the electrical characteristics of the core bipolar transistor.

SUMMARY

According to an embodiment of a bipolar transistor structure, the structure includes an epitaxial layer on a semiconductor substrate, a bipolar transistor device formed in the epitaxial layer, and a trench structure formed in the epitaxial layer adjacent at least two opposing lateral sides of the bipolar transistor device. The trench structure includes a field plate spaced apart from the epitaxial layer by an insulating material. A base contact is connected to a base of the bipolar transistor device and an emitter contact is connected to an emitter of the bipolar transistor device. The emitter contact is isolated from the base contact. An electrical connection is provided between the emitter contact and the field plate.

According to an embodiment of a method of manufacturing a bipolar transistor structure, the method includes forming an epitaxial layer on a semiconductor substrate, forming a bipolar transistor device in the epitaxial layer and forming a trench structure in the epitaxial layer adjacent at least two opposing lateral sides of the bipolar transistor device. The trench structure includes a field plate spaced apart from the epitaxial layer by an insulating material. The method further includes connecting a base contact to a base of the bipolar transistor device and connecting an emitter contact to an emitter of the bipolar transistor device so that the emitter contact and the base contact are isolated from one another. An electrical connection is formed between the emitter contact and the field plate.

According to an embodiment of an integrated transistor structure, the structure includes an epitaxial layer on a semiconductor substrate, a power transistor formed in a first region of the epitaxial layer having a drain region, a source region and a body region shorted to the source region, and a bipolar transistor formed in a second region of the epitaxial layer spaced apart from the power transistor. A first trench structure is formed in the epitaxial layer adjacent at least two opposing lateral sides of the power transistor. The first trench structure includes a gate electrode spaced apart from a channel region of the power transistor by an insulating material. A second trench structure is formed in the epitaxial layer adjacent at least two opposing lateral sides of the bipolar transistor. The second trench structure includes a trench electrode spaced apart from the epitaxial layer by an insulating material. The gate electrode, base of the bipolar transistor, and emitter of the bipolar transistor are connected to different contacts isolated from one another. The emitter and the trench electrode are at the same potential.

According to an embodiment of an integrated circuit, the integrated circuit includes a vertical diffused MOS power transistor and a bipolar transistor formed in the same epitaxial semiconductor layer. The vertical diffused MOS power transistor has a source region shorted to a body region and a gate electrode spaced apart from a channel region by an insulating material. The gate electrode, base of the bipolar transistor, and emitter of the bipolar transistor are connected to different contacts electrically isolated from one another. At least two opposing lateral sides of the bipolar transistor are adjacent a trench structure formed in the epitaxial layer which includes a trench electrode spaced apart from the epitaxial layer by an insulating material. The emitter and the trench electrode are at the same potential.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

The embodiments described herein provide a device design where the influences driving the instabilities previously described herein are minimized. The device is embedded in a mesa-type structure, i.e. in narrow silicon stripes between trenches which include a field plate. The mesa stripes together with a small emitter-base pitch reduce the spatial extension of the individual transistor cells, minimizing the available distances for a lateral instability.

Figure 2:
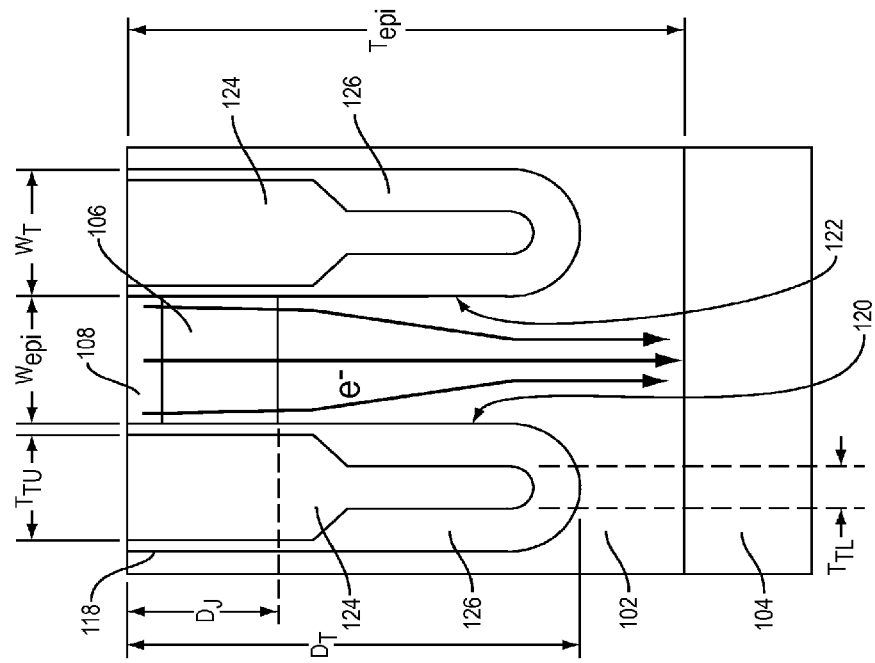
FIG. 2 is a schematic cross-sectional view of the bipolar device in FIG. 1.
Figure 1:
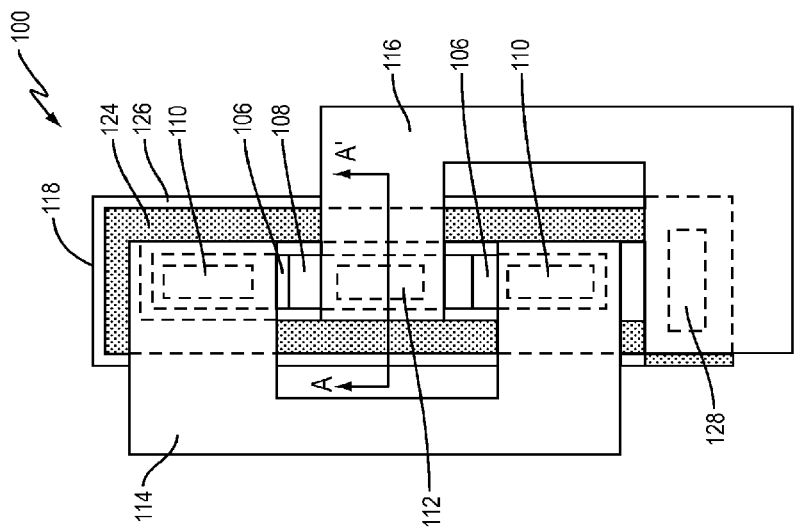
FIG. 1 is a top-down plan view of a bipolar transistor structure according to an embodiment.

FIG. 1 illustrates a top-down plan view of a bipolar transistor structure 100 according to an embodiment. FIG. 2 illustrates a schematic cross-sectional view of the bipolar transistor structure 100 along the line labeled A-A' in FIG. 1. The bipolar transistor structure 100 includes an epitaxial layer 102 grown on a semiconductor substrate 104 such as a silicon substrate or a compound semiconductor substrate. A bipolar transistor device is formed in the epitaxial layer 102. The bipolar device has a collector including the substrate 104 and the portion of the epitaxial layer 102 between the substrate 104 and a base 106. The base 106 is adjacent the collector and an emitter 108 is adjacent the base 106 so that the base 106 is interposed between the collector and the emitter 108 in a direction perpendicular to the substrate 104. The base 106 and the emitter 108 have the same cross-sectional width according to this embodiment.

In some embodiments, the substrate 104, epitaxial layer 102 and emitter 108 are n doped, and the base 106 is p doped. In other embodiments, these regions of the bipolar device have the opposite doping types. In either configuration, a base contact 110 e.g. made of tungsten or any other suitable material is connected to the base 106 and an emitter contact 112 e.g. made of tungsten or any other suitable material is connected to the emitter 108 and isolated from the base contact 110 to ensure proper operation of the bipolar device. The base 106 may have a first region of a higher doping concentration adjacent each base contact 110 and a lower doping concentration elsewhere. In one embodiment, the net dose of the base 106 ranges from $0.5e13/cm^2$ to $1e14/cm^2$. Alternatively, the base 106 may have a generally uniform doping concentration throughout. Two base contacts 110 are shown in FIG. 1, but any desirable number of base contacts can be provided. A base metal connection 114 is coupled to each base contact 110 and an emitter metal connection 116 is similarly coupled to the emitter contact 112 to provide connection terminals for the bipolar device. FIG. 2 shows the bipolar device from the upper surface of the epitaxial layer 102 to the substrate 104 for ease of illustration only, and thus the contacts 110/112 and metal connections 114/116 are not shown in FIG. 2.

A trench structure 118 is formed in the epitaxial layer 102 adjacent at least two opposing lateral sides 120, 122 of the bipolar transistor device. According to the embodiment shown in FIG. 1, the trench structure 118 surrounds the bipolar transistor device on all lateral sides of the bipolar transistor device. The trench structure 118 includes a field plate 124 spaced apart from the epitaxial layer 102 by an insulating material 126. A field plate contact 128 e.g. made of polysilicon or any other suitable material is connected to the field plate 124 of the trench structure 118. FIG. 1 shows an electrical connection between the emitter contact 112 and the field plate contact 128 so that the emitter 108 and the field plate 124 are at the same potential. Accordingly, the emitter 108 and the field plate 124 can be coupled to a zero or negative potential to ensure optimal performance of the bipolar device. The field plate 124 therefore forms part of the active bipolar device, and the trench structure 118 is used for more than just device isolation.

The base-collector breakdown voltage that results from the trench field-plate construction is much higher than the corresponding vertical breakdown voltage of a planar well for analog devices. As such, the electric field amplitude and, hence, impact-ionization is minimized for a given voltage. In addition, the trench field plate 124 is electrically connected to the emitter 108 according to this embodiment, ensuring that the parasitic vertical MOS device is not switched on. Also, the capacitance between the trench field plate 124 and the substrate 104 (i.e. collector) constitutes a damping element against device oscillations. For a sufficiently narrow mesa stripe, the location of the maximum electric field is located at the inner bottom edges of the trench structure 118 and the main bipolar current path is in the middle of the mesa region as indicated by the arrows in FIG. 2, minimizing impact ionization within the base-collector space charge region.

The trench structure 118 can extend into the epitaxial layer 102 to a depth $D_T$ ranging between ⅓ and 1.5 times the thickness $T_{epi}$ of the epitaxial layer 102. The ratio between the width $W_T$ of the trench structure 118 and the width $W_{epi}$ of the epitaxial layer 102 in the region of the epitaxial layer 102 surrounded by the trench structure 118 can be between 2/1 and 1/2. The junction formed between the base 106 and the collector can be at a depth $D_j$ in the epitaxial layer 102 between 1/10 and 4/5 of the depth $D_T$ of the trench structure 118. In some embodiments, the field plate 124 is thicker ($T_{TU}$) further from the substrate 104 and thinner ($T_{TL}$) closer to the substrate 104 as shown in FIG. 2.

Figure 3:
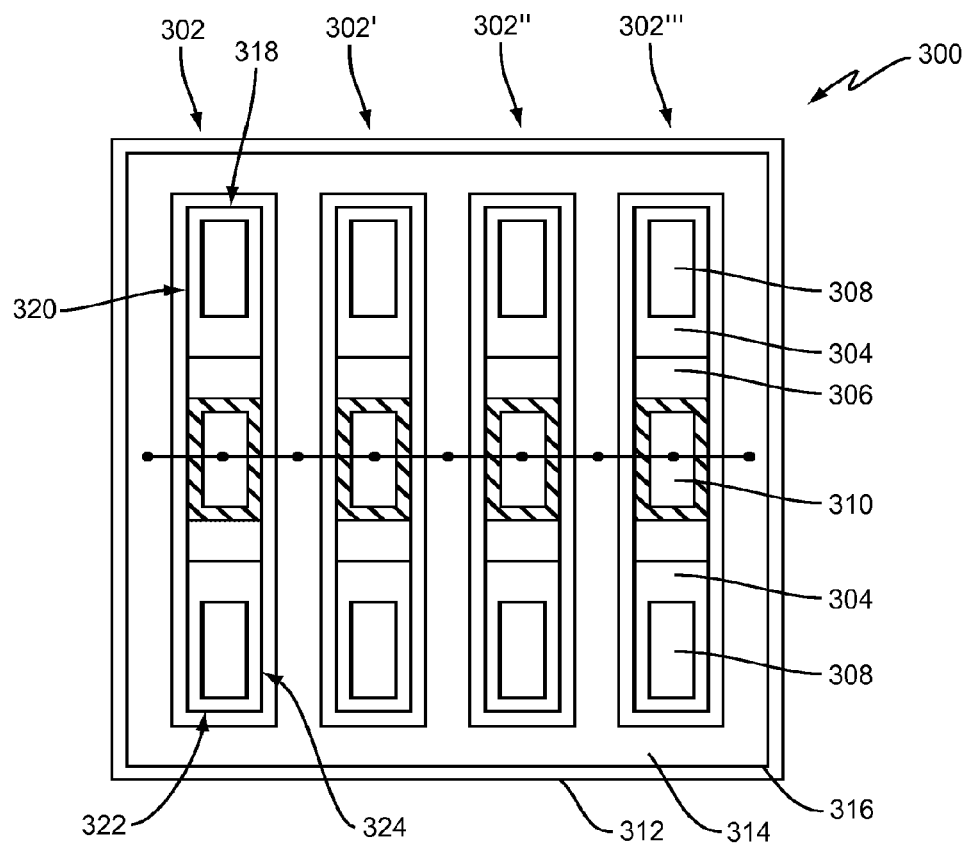
FIG. 3 is a top-down plan view of a bipolar transistor structure according to another embodiment.

FIG. 3 illustrates a top-down plan view of a bipolar transistor structure 300 according to another embodiment. According to this embodiment, the bipolar transistor device is formed from a plurality of transistor cells 302 formed in an epitaxial layer (out of view in FIG. 3). Each transistor cell 302 includes a collector (out of view in FIG. 3), a base 304 adjacent the collector and an emitter 306 adjacent the base 304 so that the base 304 is interposed between the collector and the emitter 306 in a direction perpendicular to the substrate (out of view in FIG. 3). Each transistor cell 302 has one or more base contacts 308 for contacting the base 304 and one or more emitter contacts 310 for contacting the emitter 306 of each transistor cell 302. A trench structure 312 includes a field plate 314 spaced apart from the epitaxial layer by an insulating material 316. An electrical connection is schematically shown in FIG. 3 between the emitter contact 310 of each transistor cell 302 and the field plate 314 of the trench structure 312 so that the emitter 306 of each cell 302 and the field plate 314 are at the same potential. The trench structure 312 surrounds each transistor cell 302 on all lateral sides 318, 320, 322, 324 of each transistor cell 302 according to this embodiment, but can be adjacent two opposing lateral sides of each cell for open trench technologies. The relatively narrow regions of the silicon epitaxial layer between the trenches in which the bipolar device is formed reduce the spatial extension of the individual cells, minimizing the available distances for a lateral instability. In some embodiments, the width/length ratio of an individual emitter cell can range from 1:3 to 1:20.

Figure 4:
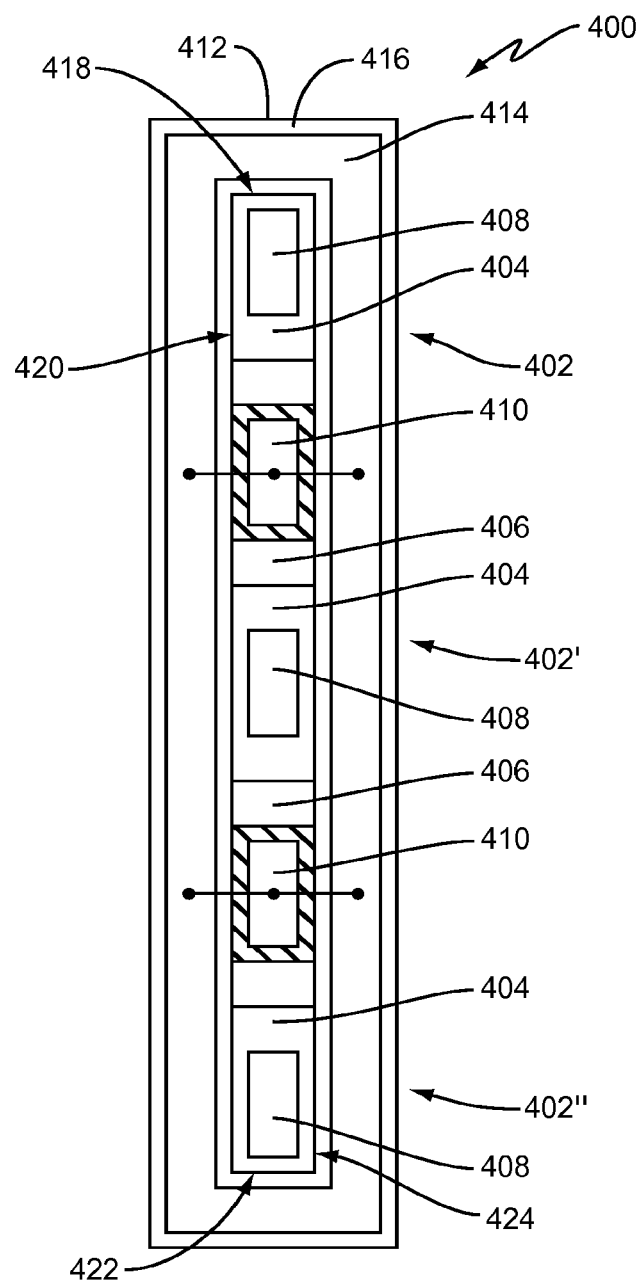
FIG. 4 is a top-down plan view of a bipolar transistor structure according to yet another embodiment.

FIG. 4 illustrates a top-down plan view of a bipolar transistor structure 400 according to yet another embodiment. According to this embodiment, the bipolar transistor device is formed from a plurality of transistor cells 402 formed in an epitaxial layer (out of view in FIG. 4). Each transistor cell 402 includes a collector (out of view in FIG. 4), a base 404 adjacent the collector and an emitter 406 adjacent the base 404 so that the base 404 is interposed between the collector and the emitter 406 in a direction perpendicular to the substrate (out of view in FIG. 4). Each transistor cell 402 has one or more base contacts 408 for contacting the base 404 and one or more emitter contacts 410 for contacting the emitter 406 of each transistor cell 402. A trench structure 412 includes a field plate 414 spaced apart from the epitaxial layer by an insulating material 416. An electrical connection is schematically shown in FIG. 4 between the emitter contact 410 of each transistor cell 402 and the field plate 414 of the trench structure 412 so that the emitter 406 of each cell 402 and the field plate 414 are at the same potential. Unlike the embodiment shown in FIG. 3, the transistor cells 402 are directly adjacent one another (i.e. no intervening trench between the individual cells) and adjacent cells 402 can share base regions. The trench structure 412 surrounds the plurality of transistor cells 402 on all outer lateral sides 418, 420, 422, 424 of the bipolar transistor device according to this embodiment, but can be adjacent two opposing lateral sides of each cell for open trench technologies.

The field plate trench construction allows for a much higher base doping level without adversely influencing the collector-base breakdown voltage, providing more flexibility for optimizing bipolar current gain and internal base resistance. This enables bipolar and power devices to be readily integrated on the same die and in the same epitaxial layer, providing more flexibility in selecting the thickness of the epitaxial layer and the doping of the base.

Figure 6:
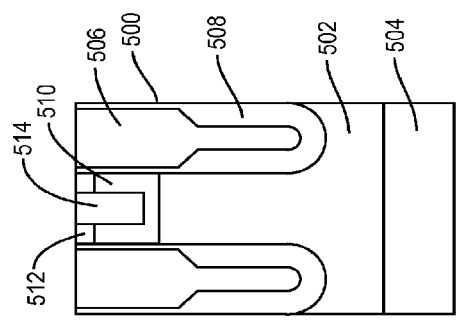
FIG. 6 is a schematic cross-sectional view of the power transistor in FIG. 5.
Figure 5:
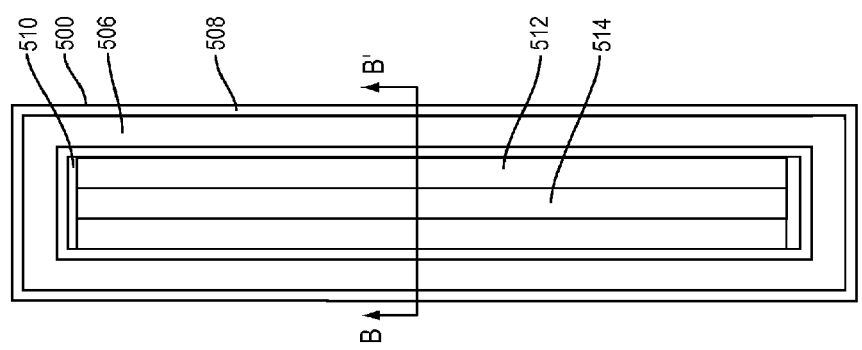
FIG. 5 is a top-down plan view of an embodiment of a power transistor formed in a different region of the same epitaxial layer as a bipolar transistor on the same die.

FIG. 5 illustrates a top-down plan view of an embodiment of a power transistor formed in a different region of the same epitaxial layer as a bipolar transistor on the same die. FIG. 6 illustrates a schematic cross-sectional view of the power transistor along the line labeled B-B' in FIG. 5. The bipolar transistor is out of view in FIGS. 5 and 6 because it is formed in a different region of the epitaxial layer and is spaced apart from the power transistor. The bipolar transistor can be formed in accordance with any of the bipolar transistor structure embodiments described herein. The bipolar transistor and the power transistor together form an integrated transistor structure.

At least two opposing lateral sides of the power transistor are adjacent a trench structure 500 formed in an epitaxial layer 502 on a substrate 504. Unlike the bipolar transistor embodiments described herein, the trench structure 500 adjacent the power transistor includes a gate electrode 506 spaced apart from a channel region of the power transistor by an insulating material 508. The gate electrode 506 controls inversion of the channel which arises in a body 510 of the power transistor, and thus the conducting state of the power transistor. The gate electrode 506 is not connected to the body 510 or source 512 of the power transistor. The substrate 504 forms the drain of the power transistor. A vertical stripe 514 having the same doping type as the base 510 is formed in the center of the power transistor and extends through the source 512 into the body 510, shorting the source 512 and the body 510 of the power transistor.

The power transistor can be a DMOS-type power transistor such as a VDMOS transistor as illustrated in FIGS. 5 and 6. The gate electrode 506 of the power transistor, the base of the bipolar transistor (out of view in FIGS. 5 and 6), and the emitter of the bipolar transistor (also out of view in FIGS. 5 and 6) are connected to different contacts isolated from one another which are not shown for ease of illustration of the power transistor. The emitter of the bipolar transistor and the trench electrode included in the trench structure adjacent at least two opposing lateral sides of the bipolar transistor are at the same potential as previously described herein. According to an embodiment, an electrical connection is formed between the trench electrode included in the trench structure adjacent the bipolar transistor and the emitter contact connected to the emitter of the bipolar transistor as previously described herein so that the emitter and the trench electrode are at the same potential, e.g. a zero or negative potential.

Figure 8:
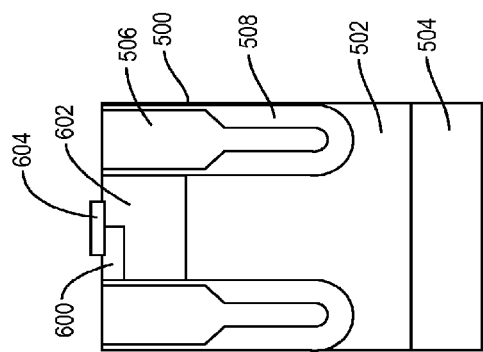
FIG. 8 is a schematic cross-sectional view of the power transistor in FIG. 7.
Figure 7:
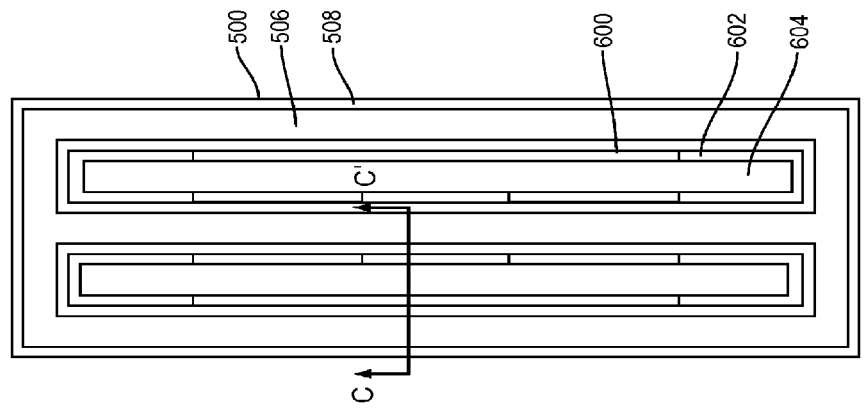
FIG. 7 is a top-down plan view of another embodiment of a power transistor formed in a different region of the same epitaxial layer as a bipolar transistor on the same die.

FIG. 7 illustrates a top-down plan view of another embodiment of a power transistor formed in a different region of the same epitaxial layer as a bipolar transistor on the same die. FIG. 8 illustrates a schematic cross-sectional view of the power transistor along the line labeled C-C' in FIG. 7. The bipolar transistor is out of view in FIGS. 7 and 8 because it is formed in a different region of the epitaxial layer and is spaced apart from the power transistor. The bipolar transistor can be formed in accordance with any of the bipolar transistor structure embodiments described herein. The bipolar transistor and the power transistor together form an integrated transistor structure.

The power transistor of FIGS. 7 and 8 has the same structure as the power transistor of FIGS. 5 and 6, except has alternating source and body regions 600, 602 of different doping types with a common contact 604 formed on the top surface of the epitaxial layer 502. The common contact 604 shorts the source 600 of the power transistor to the body 602. The power transistors described herein may have an n-type substrate, p-type body and n-type source. Alternatively, the power transistors described herein may have a p-type substrate, n-type body and p-type source. In either case, the integrated transistor structure embodiments including power and bipolar transistors can be used to manufacture circuits that use both power transistors and bipolar transistors. In some embodiments, a monolithic die includes bipolar and/or CMOS control circuitry with DMOS power devices. One type of circuit may include a driver e.g. for motors that includes input stages and output stages. The input circuitry has control inputs that may include bipolar and/or CMOS circuits such as schmitt-triggers with hysteresis. The bipolar transistors can be implemented in accordance with any of the bipolar transistor structure embodiments disclosed herein. The output stages can include DMOS circuits such as half-bridges. The DMOS transistors are implemented in accordance with any of the power transistor structure embodiments disclosed herein in the same epitaxial layer as the bipolar transistors. Of course, those skilled in the art can readily utilize the integrated transistor structure embodiments described herein in other circuit designs. The trench structure embodiments described herein provide sufficient transistor isolation while also making the bipolar transistors more robust by integrating the trench electrodes into the active bipolar transistor cells as described herein.

Figure 9:
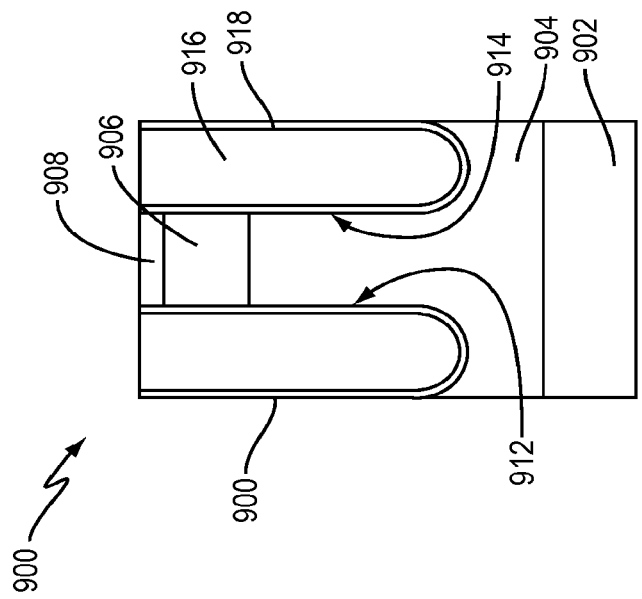
FIG. 9 is a schematic cross-sectional view of a trench structure adjacent at least two opposing lateral sides of a bipolar device according to an embodiment.

FIG. 9 illustrates a schematic cross-sectional view of a trench structure 900 adjacent at least two opposing lateral sides of a bipolar device according to an embodiment. The bipolar device has a collector including a substrate 902 and the portion of an epitaxial layer 904 between the substrate 902 and a base 906 of the device. An emitter 908 is formed above the base 906 in the epitaxial layer 904. A trench structure 910 is formed in the epitaxial layer 904 adjacent at least two opposing lateral sides 912, 914 of the bipolar transistor device. The trench structure 910 includes a field plate 916 spaced apart from the epitaxial layer 904 by an insulating material 918. According to this embodiment, the field plate 916 has a generally uniform width adjacent both the emitter 908 and the base. The field plate 916 is continuous and of a single construction.

Figure 10:
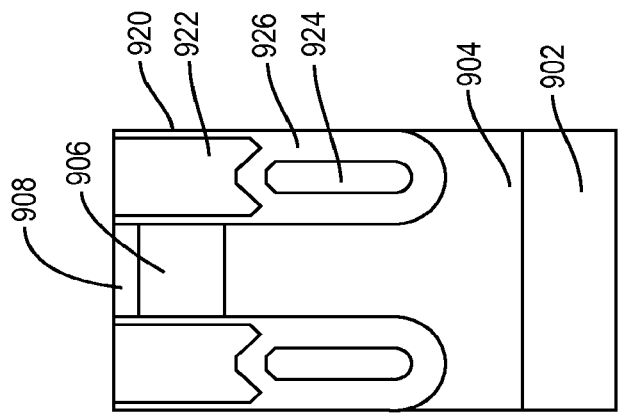
FIG. 10 is a schematic cross-sectional view of another embodiment of a trench structure adjacent at least two opposing lateral sides of a bipolar device.

FIG. 10 illustrates a schematic cross-sectional view of another embodiment of a trench structure 920 adjacent at least two opposing lateral sides of a bipolar device. The bipolar device has the same construction as the device shown in FIG. 9. However, the field plate in the trench structure includes a first electrically conductive region 922 disposed in a lower part of the trench structure 920 and a second electrically conductive region 924 disposed in an upper part of the trench structure 920 above the first electrically conductive region 922. The first and second electrically conductive regions 922, 924 are spaced apart from one another by an insulating material 926. The second (upper) electrically conductive region 920 is coupled to an emitter contact (out of view) via an electrical connection as previously described herein so that the upper portion 922 of the field plate and the emitter 908 are at the same potential. The first (lower) electrically conductive region 924 is at the same potential as the emitter 908 or the base 906.

Figure 11:
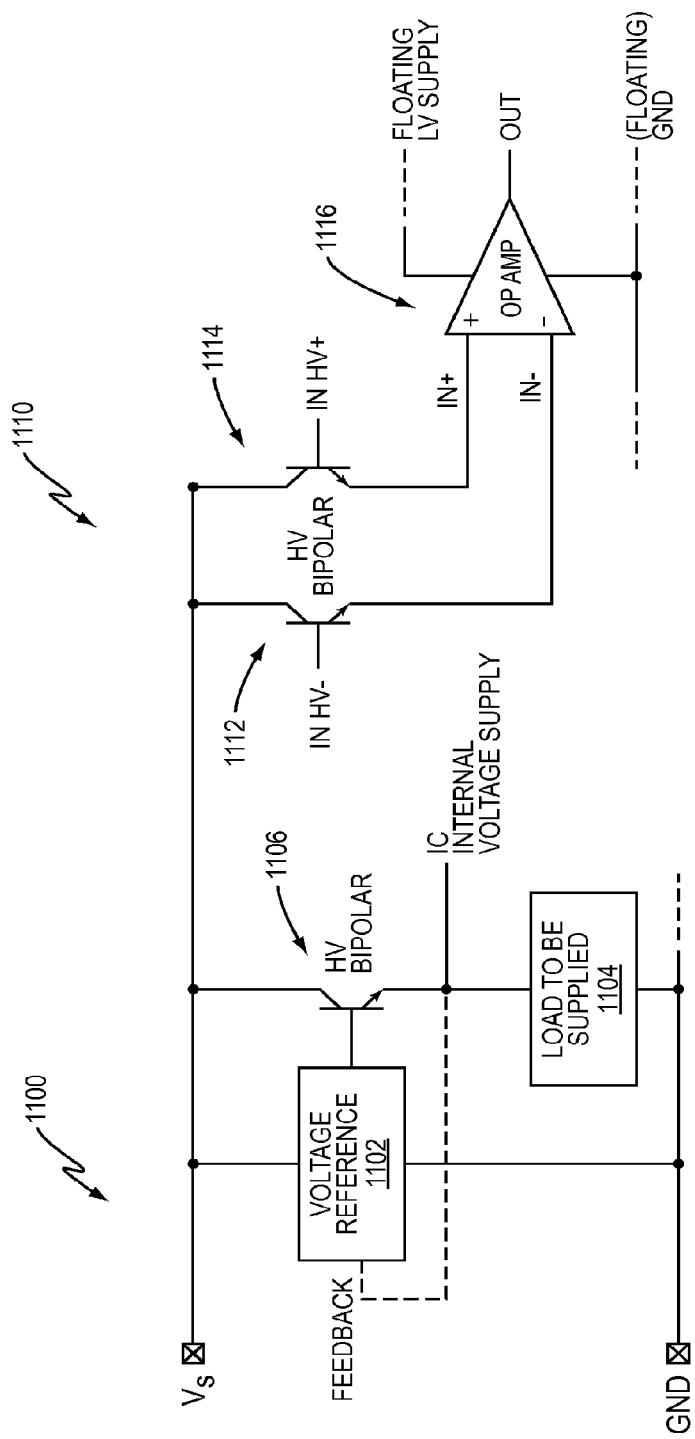
FIG. 11 illustrates circuit schematics of an embodiment of two circuits that employ the bipolar device in FIG. 1.

FIG. 11 illustrates two circuits 1100 and 1110 that employ any of the bipolar transistor structures described herein. The first circuit 1100 includes a voltage reference generator 1102 coupled to a voltage source (Vs) and ground (GND), a load 1104 and a high voltage bipolar transistor 1106 having a structure in accordance with any of the embodiments previously described herein. The output of the voltage reference generator 1102 is coupled to the base of the high voltage bipolar transistor 1106. In response, the high voltage bipolar transistor 1106 provides an internal supply voltage to the load 1104. The supply voltage may be fed back to the voltage reference generator 1102 in a closed-loop configuration. The second circuit 1110 includes two high voltage bipolar transistors 1112 and 1114 coupled in a differential amplifier configuration. Both high voltage bipolar transistors 1112 and 1114 have a structure in accordance with any of the embodiments previously described herein. The second circuit 1110 further includes an operational amplifier 1116 that produces an output (OUT) in response to the differential signal inputs (IN+/IN−) provided by the respective bipolar transistors 1112 and 1114. The differential amplifier formed by the pair of bipolar transistors 1112 and 1114 drives the operational amplifier 1116 in response to the magnitude of the difference in the inputs (IN HV+/IN HV−) to the respective bipolar transistors 1112 and 1114. The bipolar transistor structures described herein can be used in various other types of circuits, and therefore the circuits shown in FIG. 11 are exemplary circuits and should not be considered limiting in any way.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a bipolar transistor structure, comprising:
    forming an epitaxial layer on a semiconductor substrate;
    forming a bipolar transistor device in the epitaxial layer, the bipolar transistor device comprising a base in the epitaxial layer, a collector including a portion of the epitaxial layer between the substrate and the base, and an emitter in the epitaxial layer adjacent the base so that the base is interposed between the collector and the emitter in a direction perpendicular to a main surface of the substrate;
    forming a trench structure in the epitaxial layer adjacent at least two opposing lateral sides of the bipolar transistor device, the trench structure including a field plate spaced apart from the epitaxial layer by an insulating material;
    connecting a base contact to a base of the bipolar transistor device; and
    connecting an emitter contact to an emitter of the bipolar transistor device so that the emitter contact and the base contact are isolated from one another.

2. The method of claim 1, comprising:
    forming a first electrically conductive region of the field plate in a lower part of the trench structure; and
    forming a second electrically conductive region of the field plate in an upper part of the trench structure above the first electrically conductive region and spaced apart from the first electrically conductive region by the insulating material.

3. The method of claim 2, comprising:
coupling the second electrically conductive region to the emitter contact via an electrical connection; and
coupling the first electrically conductive region to the same potential as the emitter or the base.

4. The method of claim 1, comprising:
forming a plurality of transistor cells in the epitaxial layer that form the bipolar transistor device, each transistor cell including a collector, a base adjacent the collector and an emitter adjacent the base so that the base is interposed between the collector and the emitter.

5. The method of claim 1, comprising doping a first region of the base disposed adjacent the base contact more heavily than a second region of the base disposed further away from the base contact.

6. A method of manufacturing a bipolar transistor structure, comprising:
forming an epitaxial layer on a semiconductor substrate;
forming a bipolar transistor device in the epitaxial layer;
forming a trench structure in the epitaxial layer adjacent at least two opposing lateral sides of the bipolar transistor device, the trench structure including a field plate spaced apart from the epitaxial layer by an insulating material;
connecting a base contact to a base of the bipolar transistor device;
connecting an emitter contact to an emitter of the bipolar transistor device so that the emitter contact and the base contact are isolated from one another;
forming a first electrically conductive region of the field plate in a lower part of the trench structure; and
forming a second electrically conductive region of the field plate in an upper part of the trench structure above the first electrically conductive region and spaced apart from the first electrically conductive region by the insulating material.

7. The method of claim 6, further comprising:
coupling the second electrically conductive region to the emitter contact via an electrical connection; and
coupling the first electrically conductive region to the same potential as the emitter or the base.

8. The method of claim 6, further comprising:
forming a plurality of transistor cells in the epitaxial layer that form the bipolar transistor device, each transistor cell including a collector, a base adjacent the collector and an emitter adjacent the base so that the base is interposed between the collector and the emitter.

9. The method of claim 6, further comprising:
doping a first region of the base disposed adjacent the base contact more heavily than a second region of the base disposed further away from the base contact.

10. A method of manufacturing a bipolar transistor structure, comprising:
forming an epitaxial layer on a semiconductor substrate;
forming a bipolar transistor device in the epitaxial layer;
forming a trench structure in the epitaxial layer adjacent at least two opposing lateral sides of the bipolar transistor device, the trench structure including a field plate spaced apart from the epitaxial layer by an insulating material;
connecting a base contact to a base of the bipolar transistor device;
connecting an emitter contact to an emitter of the bipolar transistor device so that the emitter contact and the base contact are isolated from one another; and
doping a first region of the base disposed adjacent the base contact more heavily than a second region of the base disposed further away from the base contact.

11. The method of claim 10, further comprising:
forming a first electrically conductive region of the field plate in a lower part of the trench structure; and
forming a second electrically conductive region of the field plate in an upper part of the trench structure above the first electrically conductive region and spaced apart from the first electrically conductive region by the insulating material.

12. The method of claim 11, further comprising:
coupling the second electrically conductive region to the emitter contact via an electrical connection; and
coupling the first electrically conductive region to the same potential as the emitter or the base.

13. The method of claim 10, further comprising:
forming a plurality of transistor cells in the epitaxial layer that form the bipolar transistor device, each transistor cell including a collector, a base adjacent the collector and an emitter adjacent the base so that the base is interposed between the collector and the emitter.

\* \* \* \* \*